(12) United States Patent
Morita et al.

(10) Patent No.: US 8,076,615 B2
(45) Date of Patent: Dec. 13, 2011

(54) SUBSTRATE PROCESSING APPARATUS AND METHOD OF MANUFACTURING SEMICONDUCTOR DEVICE

(75) Inventors: Shinya Morita, Toyama (JP); Koichi Sada, Toyama (JP); Takayuki Nakada, Toyama (JP); Tomoyuki Matsuda, Toyama (JP)

(73) Assignee: Hitachi Kokusai Electric, Inc., Tokyo (JP)

(*) Notice: Subject to any disclaimer, the term of this patent is extended or adjusted under 35 U.S.C. 154(b) by 159 days.

(21) Appl. No.: 12/548,066

(22) Filed: Aug. 26, 2009

(65) Prior Publication Data

US 2010/0051597 A1 Mar. 4, 2010

(30) Foreign Application Priority Data

Aug. 27, 2008 (JP) .................................. 2008-218003
Jul. 14, 2009 (JP) .................................. 2009-165679

(51) Int. Cl.
*F27B 5/14* (2006.01)
*C23C 16/00* (2006.01)

(52) U.S. Cl. ........ 219/390; 219/405; 219/411; 392/416; 392/418; 118/724; 118/725; 118/50.1

(58) Field of Classification Search .................. 219/390, 219/405, 411, 201; 392/416, 418; 118/724, 118/725, 50.1
See application file for complete search history.

(56) References Cited

U.S. PATENT DOCUMENTS 6,482,753 B1 * 11/2002 Tometsuka .................... 438/758

FOREIGN PATENT DOCUMENTS

| JP | 8-124869 | 5/1996 |
| JP | 2000-26973 | 1/2000 |
| JP | 2002-334868 | 11/2002 |
| JP | 2002-353145 | 12/2002 |

* cited by examiner

*Primary Examiner* — Shawntina Fuqua
(74) *Attorney, Agent, or Firm* — Brundidge & Stanger, P.C.

(57) ABSTRACT

A substrate processing apparatus comprises: an outer tube; a manifold connected to the outer tube and made of a non-metal material; an inner tube disposed in the manifold at a more inner side than the outer tube and configured to process a substrate therein; a heating device installed at a more outer side than the outer tube and configured to heat the inside of the outer tube; a lid configured to open and close an opening of the manifold, with a seal member intervened therebetween; and a heat absorption member installed in the manifold, with a bottom end of the inner tube intervened therebetween, and configured to absorb heat from the heating device, the heat absorption member being made of a non-metal material.

9 Claims, 12 Drawing Sheets

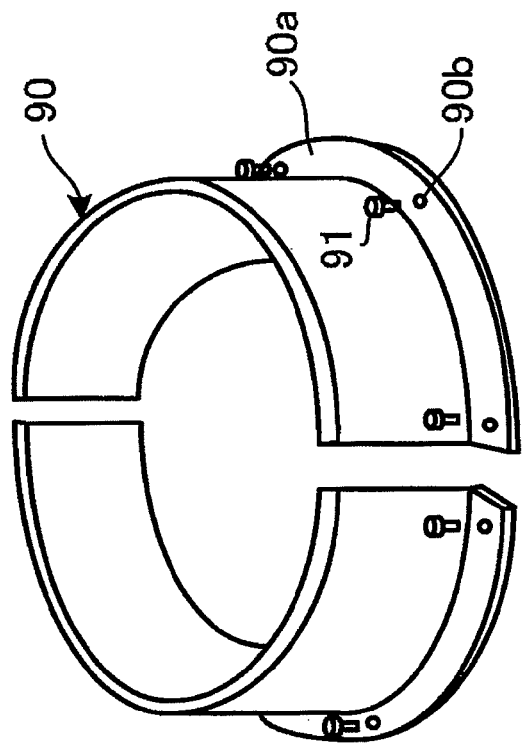
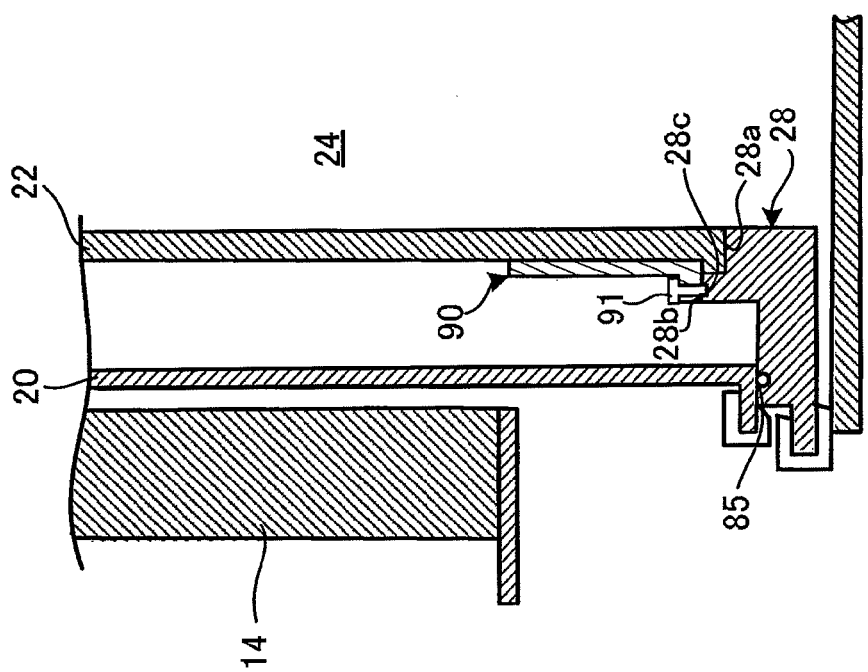
Fig. 5A
Fig. 5B

SUBSTRATE PROCESSING APPARATUS AND METHOD OF MANUFACTURING SEMICONDUCTOR DEVICE

CROSS-REFERENCE TO RELATED PATENT APPLICATION

This U.S. non-provisional patent application claims priority under 35 U.S.C. §119 of Japanese Patent Application Nos. 2008-218003, filed on Aug. 27, 2008, and 2009-165679, filed Jul. 14, 2009, in the Japanese Patent Office, the entire contents of which are hereby incorporated by reference.

BACKGROUND OF THE INVENTION

1. Field of the Invention

The present invention relates to a substrate processing apparatus and a method of manufacturing a semiconductor device.

2. Description of the Prior Art

As one example of a substrate processing apparatus, a semiconductor manufacturing apparatus is known. In particular, as one example of the semiconductor manufacturing apparatus, a vertical diffusion and Chemical Vapor Deposition (CVD) apparatus is known.

The vertical diffusion and CVD apparatus includes: an outer tube; an inner tube installed inside the outer tube to form a process chamber; a heating device (heater) configured to heat the inside of the outer tube, a manifold on which the outer tube and the inner tube are placed and to which an exhaust pipe and a gas introduction pipe are connected to exhaust the process chamber and supply gas into the process chamber, respectively; and a boat configured to hold a plurality of wafers aligned in a vertical direction and to be loaded into the process chamber.

The boat holding the plurality of wafers is loaded into the process chamber through a lower furnace port, and CVD films are deposited on the wafers by supplying a film-forming gas into the process chamber through the gas introduction pipe and simultaneously heating the process chamber by the heating device.

In such a vertical diffusion and CVD apparatus, as disclosed in Patent Document 1, the manifold (furnace port flange) is made of a metal.

Since the plate thickness of the metallic manifold is thin and the heat capacity thereof is low, heat is easily dissipated to the outside of the furnace port.

[Prior Art Document]
[Patent Document]

[Patent Document 1] Japanese Patent Laid-Open No. 2002-334868

However, the CVD apparatus using the metallic manifold has a problem in that the metallic manifold is corroded by attachment of reaction products that are generated by a reaction gas and a cleaning gas.

Moreover, as ICs are miniaturized, metal emission from the metallic manifold used in the CVD apparatus becomes an issue.

Therefore, in order to suppress metal contamination in a substrate to be processed, exposure of metallic parts inside the process chamber is minimized, and the manifold as well as the outer and inner tubes is made of a non-metal component such as quartz. In addition, as earthquake countermeasures, an inner tube collapse suppression member is provided for suppressing the collapse of the inner tube and is fastened by a bolt made of a non-metal component such as quartz. In the apparatus constructed as above, a reaction product (by-product) generated during the processing of the substrate within the inner tube is frequently adhered around the inner tube collapse suppression member. If the inner tube collapse suppression member is forcibly detached in such a state that the reaction product is adhered thereto, a new problem arises which breaks the bolt or the manifold made of the non-metal component such as quartz. If the bolt is broken and thus could not be taken away from the manifold, or the manifold is broken, the expensive manifold must be replaced or remanufactured.

SUMMARY OF THE INVENTION

An object of the present invention is to provide a substrate processing apparatus, which is capable of suppressing metal contamination in a substrate, suppressing collapse of an inner tube, and also suppressing adhesion of reaction products, and to provide a method of manufacturing a semiconductor device.

According to an aspect of the present invention, there is provided q substrate processing apparatus comprising: an outer tube; a manifold connected to the outer tube, the manifold being made of a non-metal material; an inner tube disposed on the manifold at a more inner side than the outer tube and configured to process a substrate therein; a heating device installed at a more outer side than the outer tube and configured to heat an inside of the outer tube; a lid configured to open and close an opening of the manifold with a seal member intervened therebetween; and a heat absorption member installed on the manifold with a bottom end of the inner tube intervened therebetween and configured to absorb heat from the heating device, the heat absorption member being made of a non-metal material.

According to another aspect of the present invention, there is provided a substrate processing apparatus comprising: an outer tube; a manifold connected to the outer tube and made of a non-metal material; an inner tube disposed in the manifold at a more inner side than the outer tube and configured to process a substrate therein; a heating device installed at a more outer side than the outer tube and configured to heat the inside of the outer tube; a lid configured to open and close an opening of the manifold, with a seal member intervened therebetween; and a press member configured to press a bottom end of the inner tube, wherein a guard part is formed at a lower outer side of the inner tube, the manifold comprises: an inner tube placement part on which the inner tube is placed; a protrusion part formed at a more outer periphery than the inner tube placement part and formed higher than the height of the guard part with respect to the inner tube placement part; and a groove part installed at a more outer periphery than the protrusion part, and one end of the press member is inserted into the protrusion part, and the other end of the press member is inserted into the groove part.

BRIEF DESCRIPTION OF THE DRAWINGS

FIG. 2A and FIG. 2B illustrate a process state and a standby state, respectively.

FIG. 5A is a longitudinal sectional view illustrating the installation of the heat insulation cylinder in a first embodiment of the present invention, and FIG. 5B is a perspective view illustrating the heat insulation cylinder in a first embodiment of the present invention.

DETAILED DESCRIPTION OF THE PREFERRED EMBODIMENTS

Hereinafter, embodiments of the present invention will be described with reference to the attached drawings.

Figure 1:
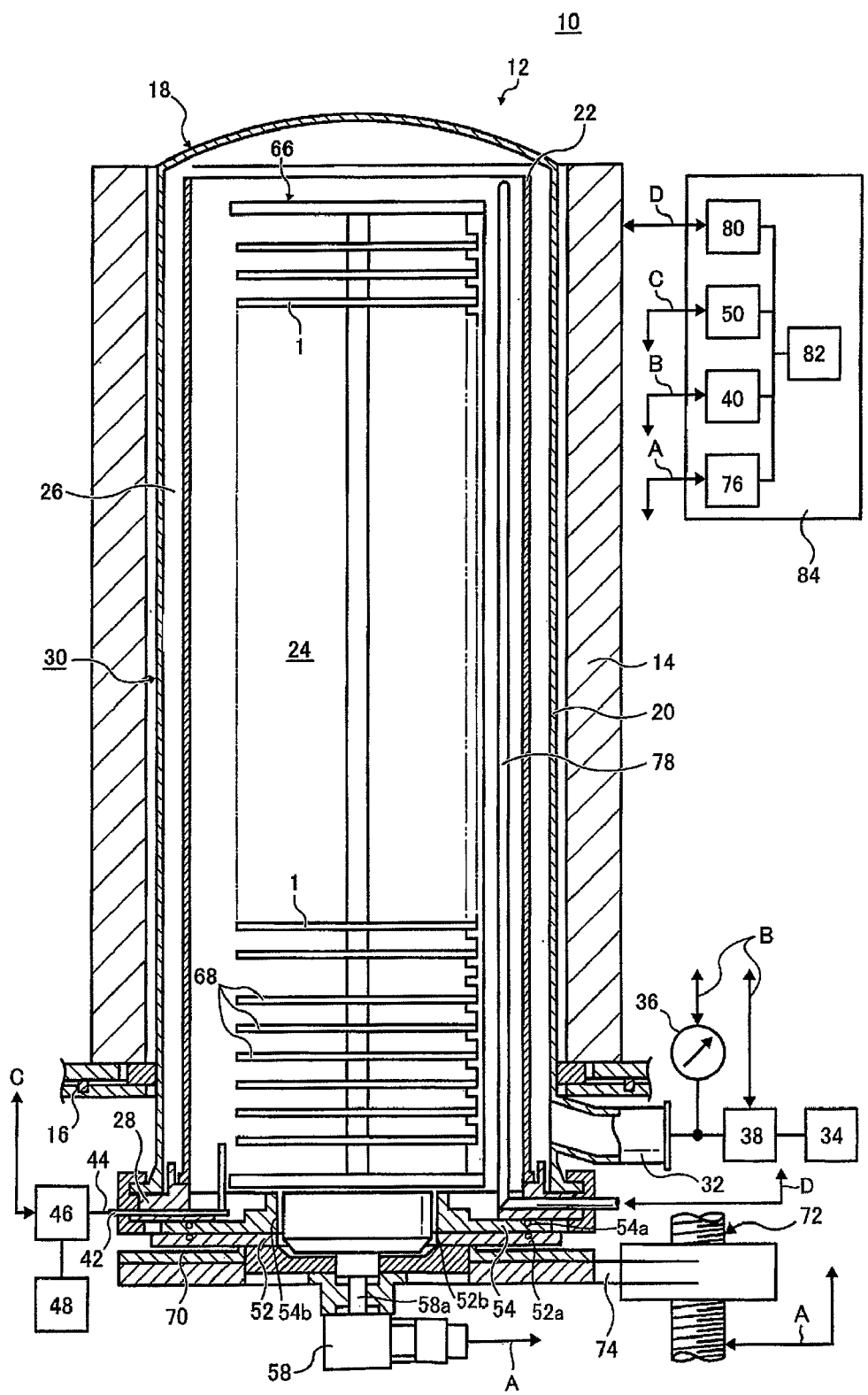
FIG. 1 is a longitudinal sectional view of a substrate processing apparatus used in an embodiment of the present invention.

FIG. 1 is a longitudinal sectional view illustrating a schematic configuration of a substrate processing apparatus 10 that is preferably used in an embodiment of the present invention.

As shown in FIG. 1, a process furnace 12 is provided with a heater 14 as a heating device. The heater 14 is cylindrically shaped and is vertically installed in such a manner that the heater 14 is supported on a heater base 16 used as a holding plate.

At the inside of the heater 14, a process tube 18 as a reaction tube is installed concentrically with the heater 14. The process tube 18 is configured by an outer tube 20 used as an outer reaction tube, and an inner tube 22 used as an inner reaction tube. The outer tube 20 is made of, for example, a heat-resistant material such as quartz ($SiO_2$) or silicon carbide (SiC), and is formed in a cylindrical shape with an inner diameter greater than an outer diameter of the inner tube 22. The outer tube 20 is formed in a cylindrical shape with a closed top end and an opened bottom end. The inner tube 22 is made of, for example, a heat-resistant material such as quartz ($SiO_2$) or silicon carbide (SiC), and is formed in a cylindrical shape with open top and bottom ends. A hollow part of the inner tube 22 forms a process chamber 24. The process chamber 24 is configured to accommodate wafers 1 that are horizontally positioned and vertically arranged in multiple stages by a boat as described later. The outer tube 20 and the inner tube 22 are installed concentrically with each other. A cylindrical space 26 is formed between the outer tube 20 and the inner tube 22. At the lower side of the outer tube 20, a manifold 28 is installed concentrically with the outer tube 20. The outer tube 20 and the inner tube 22 are placed on the manifold 28. A process vessel 30 is configured by the process tube 18 and the manifold 28.

An exhaust pipe 32 is connected to the outer tube 20 to exhaust inside atmosphere of the process chamber 24. The exhaust pipe 32 is disposed at the lower end part of the cylindrical space 26 and communicates with the cylindrical space 26.

At the downstream side of the exhaust pipe 32 opposite to the connection side with the outer tube 20, an exhaust device 34 such as a vacuum pump is connected through a pressure sensor 36 used as a pressure detector and a pressure regulator 38. The exhaust device 34 exhausts the inside of the process chamber 24 to a certain pressure (vacuum degree).

A pressure control unit 40 is electrically connected to the pressure sensor 36 and the pressure regulator 38 through electric wires B. The pressure control unit 40 controls the pressure regulator 38 so that the inside of the process chamber 24 is regulated to a desired pressure at a desired timing, based upon the pressure detected by the pressure sensor 36.

At the process vessel 30, a gas supply unit 42 is installed to communicate with the inside of the process chamber 24. A gas supply pipe 44 is connected to the gas supply unit 42.

At the upstream side of the gas supply pipe 44 opposite to the connection side with the gas supply unit 42, a mass flow controller (MFC) 46 used as a gas flow rate controller is connected, and a gas supply source 48 is connected to the MFC 46. The gas supply source 48 supplies process gas or inert gas.

A gas flow rate control unit 50 is electrically connected to the MFC 46 through an electric wire C. The gas flow rate control unit 50 controls the MFC 46 such that a desired rate of gas is supplied at a desired timing.

At the lower side of the process vessel 30, a seal cap 52 is installed. The seal cap 52 constitutes a lid that can air-tightly close a lower opening of the process chamber 24. The seal cap 52 is made of, for example, a metal material such as stainless steel or nickel alloy, and is formed in a disk shape. At the side of the seal cap 52 facing the process chamber 24, a seal cap cover 54 is installed. The seal cap 52 is made of, for example, a non-metal material such as quartz. The seal cap cover 54 covers the seal cap 52 so as to prevent the metal portion of the seal cap 52 from being exposed to the process chamber 24. The seal cap cover 54 is configured to be brought into contact with the bottom surface of the process vessel 30 in a vertical direction from the downside. At the top surface of the seal cap 52, an O-ring is installed as a first seal member 52a. At the top surface of the seal cap cover 54, another O-ring is installed as a second seal member 54a.

A circular hole 52a is formed at the center part of the seal cap 52, and another circular hole 54b is formed at the center part of the seal cap cover 54. The circular hole 52b of the seal cap 52 and the circular hole 54b of the seal cap cover 54 are overlapped with each other.

At the bottom side of the seal cap 52 opposite to the seal cap cover 54, a rotation mechanism 58 that rotates a boat 66 is installed. A rotation shaft 58a of the rotation mechanism 58 passes through the circular hole 52b of the seal cap 52 and the circular hole 54b of the seal cap cover 54 and is connected to the boat 66. The rotation mechanism 58 is configured to rotate the boat 66 so that the wafers 1 are rotated.

The boat 66 used as a substrate holder is made of, for example, a heat-resistant material such as quartz or silicon carbide. The boat 66 is configured to hold a plurality of wafers 1 at a horizontal position in multiple stages, with their centers aligned.

In addition, at the lower part of the boat 66, a plurality of heat insulation plates 68 as heat insulation members are arranged at a horizontal position in multiple stages. The heat insulation plates 68 are made of, for example, a heat-resistant material such as quartz or silicon carbide, and are formed in a disk shape. The heat insulation plates 68 suppress heat transfer from the heater 14 to the seal cap 52.

As illustrated in FIG. 1, a base 70 is vertically supported by an arm 74 of a boat elevator 72.

The boat elevator 72 is vertically installed outside the process tube 18. The boat elevator 72 is an elevating mechanism that moves the boat 66 upward and downward. That is, the boat elevator 72 loads the boat 66 into the process chamber 24, or unloads the boat 66 from the process chamber 24.

A driving control unit 76 is electrically connected to the rotation mechanism 58 and the boat elevator 72 through electric wires A. The driving control unit 76 executes a control so that the rotation mechanism 58 and the boat elevator 72 perform desired operations at a desired timing.

At the inside of the process tube 18, a temperature sensor 78 is installed as a temperature detector.

A temperature control unit 80 is electrically connected to the heater 14 and the temperature sensor 78 through electric wires D. The temperature control unit 80 controls an electrified state of the heater 14, based on temperature information detected by the temperature sensor, in order that the inside temperature of the process chamber 24 is made to have a desired temperature distribution at a desired timing.

The pressure control unit 40, the gas flow rate control unit 50, the driving control unit 76, and the temperature control unit 80 constitute an operation unit and an input/output unit, and are electrically connected to a main control unit 10 that controls the entire substrate processing apparatus 10.

The pressure control unit 40, the gas flow rate control unit 50, the driving control unit 76, the temperature control unit 80, and the main control unit 82 constitute a controller 84.

Figure 2A:
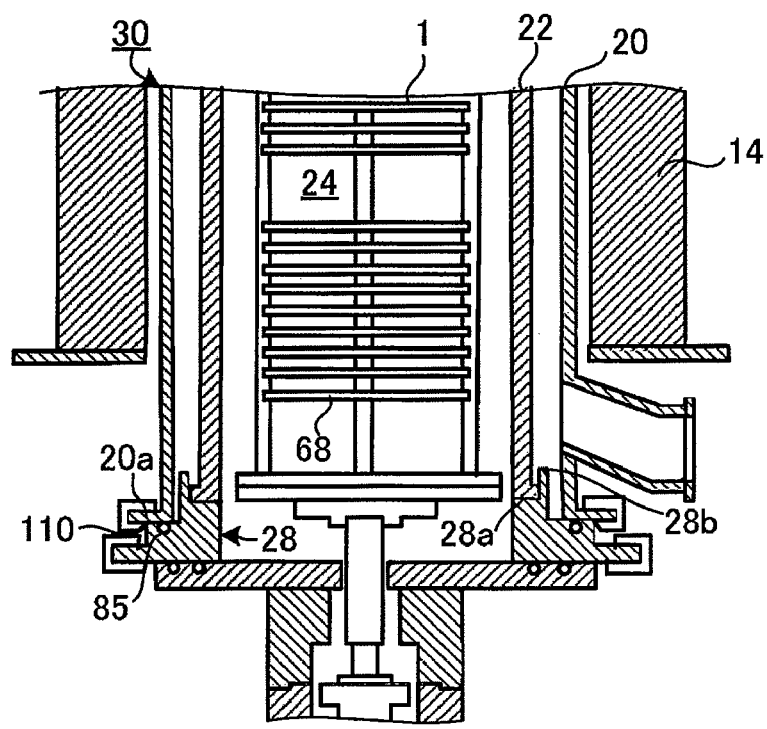
FIGS. 2A and 2B are longitudinal sectional views illustrating a main part of a conventional substrate processing apparatus. Specifically.
Figure 2B:
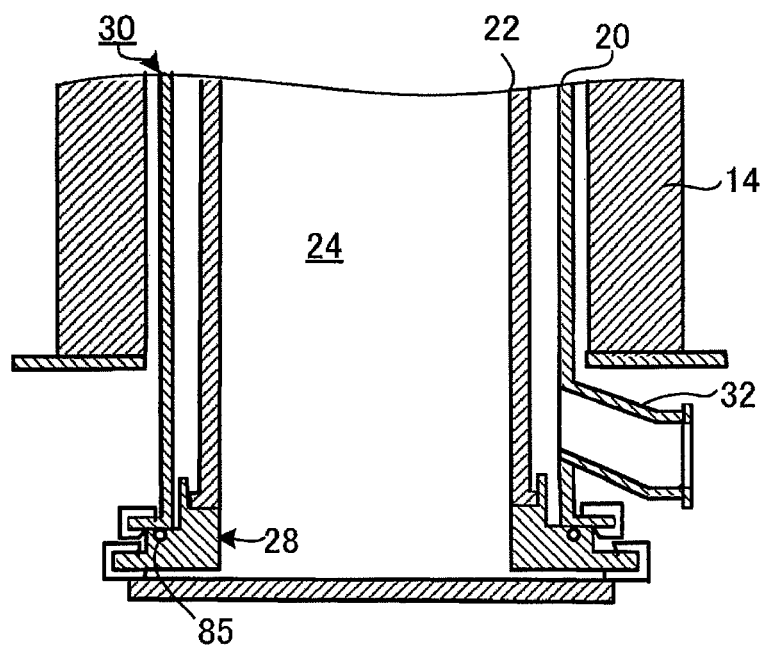

FIGS. 2A and 2B illustrate a configuration around the manifold 28.

The manifold 28 is made of quartz that is a non-metal component, and is formed in a circular-ring, flat-block shape. The manifold 28 is transparent or semitransparent.

In addition, a stepped portion is formed at an upper part of the manifold 28. A first placement part 28a on which the inner tube 22 is placed is formed at a lower part of the stepped portion, and a second placement part 28b on which a heat insulation cylinder as a heat absorption member to be described later is placed is formed at an upper part of the stepped portion.

Furthermore, the second placement part 28b is formed in an entire circumferential perimeter as a position regulation part that regulates a horizontal-direction position of the inner tube 22.

Moreover, the second placement part 28b may be formed at a predetermined interval, preferably an equal interval, instead of the entire circumferential perimeter.

At a groove formed in an entire circumferential perimeter on the top surface of the manifold 28, as a first joint surface 110 of the manifold 28 which is a bottom surface of an opening 20a of the outer tube 20, a third seal member 85 made of, for example, an O-ring, is laid.

Therefore, the manifold 28 contacts the bottom surface of the opening 20a of the outer tube 20 through the third seal member 85, so that the opening of the process vessel 30 is air-tightly closed.

Figure 3:
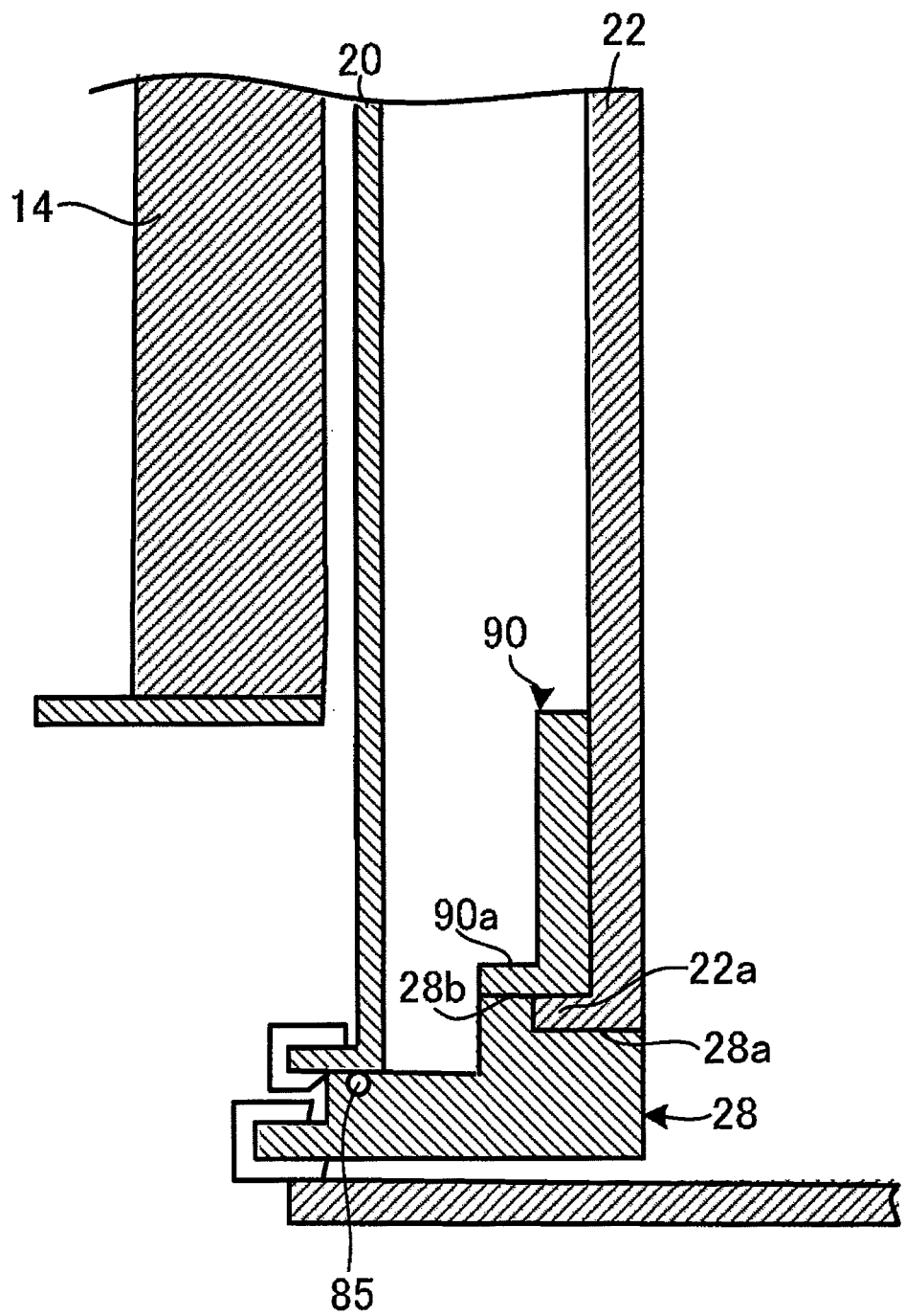
FIG. 3 is a sectional view illustrating a portion around a manifold in a first embodiment of the present invention.

FIG. 3 is a longitudinal sectional view illustrating a main part of the substrate processing apparatus having a heat insulation cylinder 90 relevant to an embodiment of the present invention.

Figure 4A:
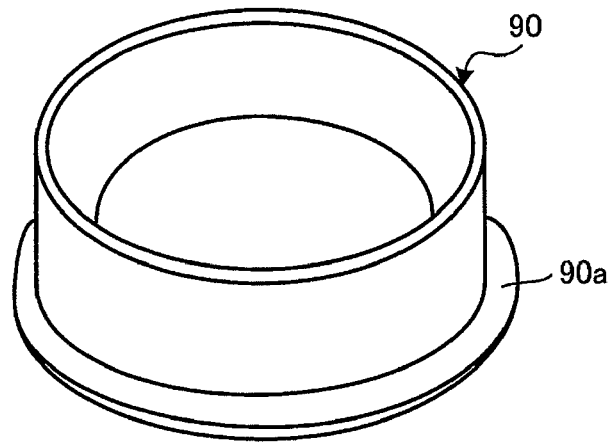
FIGS. 4A to 4C are perspective views illustrating the shapes of heat insulation cylinders in a first embodiment of the present invention.
Figure 4B:
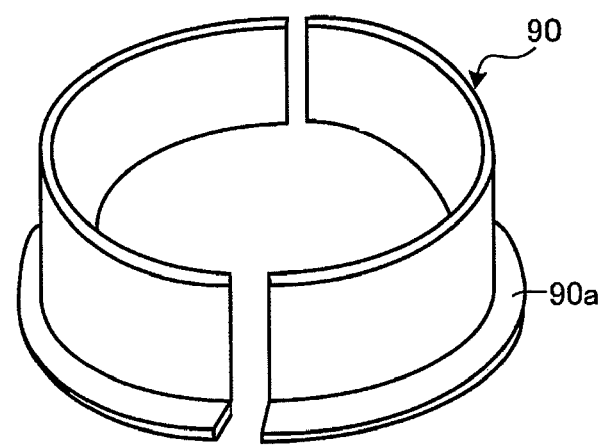
Figure 4C:
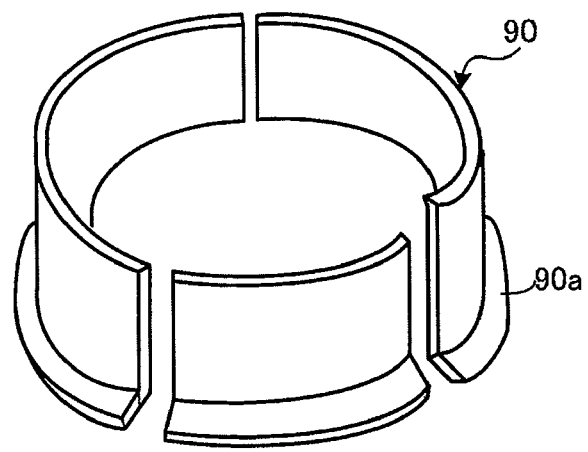

FIGS. 4A to 4C illustrate the heat insulation cylinder relevant to the embodiment of the present invention.

The heat insulation cylinder 90 is made of a heat absorption member and formed in a circular ring shape, and the heat insulation cylinder 90 has a bottom surface 90a contacting the second placement part 28b of the manifold 28 and the top surface of a protrusion part 22a of the opening of the inner tube 22.

In addition, while the heat insulation cylinder 90 is made of opaque quartz that is a non-metal component, a sandblast process (opaque polishing) may be performed on transparent quartz. The opaque quartz has a more excellent heat insulation (heat shield) effect or heat absorption effect.

Furthermore, the heat insulation cylinder 90 is not limited to an integral shape, but may be divided into, for example, two parts or three parts.

Moreover, the heat insulation cylinder 90 is disposed concentrically with the inner tube 22.

The inner tube 22 is placed at the first placement part 28a of the manifold 28. The inner surface of the heat insulation cylinder 90 contacts the outer surface of the inner tube 22, and the bottom surface 90a of the heat insulation cylinder 90 is placed from the second placement part 28b of the manifold 28 across the top surface of the protrusion part 22a of the opening of the inner tube 22.

Also, when coefficient of thermal expansion of the heat insulation cylinder 90 is different from that of the inner tube 22, the inner surface of the heat insulation cylinder 90 and the outer surface of the inner tube 22 may be arranged with spacing, without contacting each other.

FIGS. 5A and 5B illustrate an installation example of the heat insulation cylinder 90 in an embodiment of the present invention.

In the embodiment of the present invention, the heat insulation cylinder 90 is installed such that the inner tube 22 is protected from earthquake.

Several bolt holes 90b and several tap holes 28c are formed at the bottom surface 90a of the heat insulation cylinder 90 and the manifold 28, respectively, and the heat insulation cylinder 90 and the manifold 28 are fixed by bolts 91 that are movement restriction members. Therefore, metal contamination is prevented and the movement of the heat insulation cylinder 90 is restricted, so that the collapse of the inner tube 22 is further suppressed. Consequently, the inner tube 22 is protected from earthquake. As the bolts 91, quartz bolts may be used.

Next, explanation will be given on a film-forming process and a subsequent operation in an IC manufacturing method using the substrate processing apparatus 10 having the above-described configuration in accordance with an embodiment of the present invention.

In addition, in the following description, the operations of the respective elements constituting the substrate processing apparatus 10 are controlled by the controller 84.

When a plurality of wafers 1 are charged into the boat 66, as illustrated in FIG. 1, the boat 66 holding the plurality of wafers 1 is lifted by the boat elevator 72 and loaded into the process chamber 24.

In this state, the seal cap 52 seals the bottom side of the manifold 28 through the first seal member 52a, the seal cap cover 54, and the second seal member 54a.

The inside of the process chamber 24 is exhausted to a desired pressure (vacuum degree) by the exhaust device 34. In this case, the pressure inside the process chamber 24 is measured with the pressure sensor 36, and the pressure regulator 38 is feedback controlled, based upon the measured pressure.

In addition, the inside of the process chamber 24 is heated to a desired temperature by the heater 14. In this case, the electrified state of the heater 14 is feedback controlled, based upon temperature information detected by the temperature sensor 78, in order that the inside of the process chamber 24 is made to have a desired temperature distribution. Moreover, in this case, in the vicinity of the manifold 28, heat from the heater 14 is absorbed and shielded by the heat insulation cylinder 90 installed on the manifold 28 through the lower end of the inner tube 22.

Subsequently, the boat 66 is rotated by the rotation mechanism 58, and therefore, the wafers 1 are rotated.

Gas supplied from the gas supply source 48 and controlled to a desired flow rate by the MFC 46 circulates through the gas supply pipe 44 and then is introduced from the gas supply unit 42 into the process chamber 24.

The introduced gas rises up inside the process chamber 24 and outflows from the top opening of the inner tube 22 toward the cylindrical space 26, and then is exhausted through the exhaust pipe 32.

The gas contacts the surfaces of the wafers 1 when passing through the inside of the process chamber 24, and, at this time, thin films are deposited on the surfaces of the wafers 1 by a thermal CVD reaction.

When a predetermined process time passes by, inert gas is supplied from the gas supply source 48, and gas inside the process chamber 24 is replaced with the inert gas. Simultaneously, the inside of the process chamber 24 returns to the normal pressure.

After that, the seal cap 52 is moved downward by the boat elevator 72 so that the lower end of the process chamber 24 is opened, and, simultaneously, the boat 66 charged with the processed wafers 1 is unloaded to the outside of the process chamber 24.

Then, the processed wafers 1 are discharged from the boat 66.

In this embodiment, from the viewpoint of minimizing metal inside the process chamber 24 in order to prevent metal contamination of the wafers 1, the manifold 28 is made of quartz. As illustrated in FIG. 2A, since the plurality of wafers 1 and the plurality of heat insulation plates 68 made of opaque quartz are installed inside the inner tube 22 in a process state during which the substrate is processed in the process chamber 24, heat from the heater 14 is not directly irradiated onto the third seal member 85, and the temperature of the third seal member 85 becomes equal to or less than a heatproof temperature. However, as illustrated in FIG. 2B, since the wafers 1 and the heat insulation plates 68 are not installed inside the inner tube 22 in a standby state during which the substrate is not processed in the process chamber 24, for example, in a process prior to the processing of the substrate, radiant heat from the heater 14 is directly irradiated onto the third seal member 85. Particularly, since the third seal member 85 is installed in the groove of the manifold 28 made of quartz, it is difficult for heat to be let out, and the temperature of the third seal member 85 becomes higher than the heatproof temperature, so that heat deterioration is caused and seal performance is not maintained. In addition, if heat deterioration is in progress and the third seal member 85 is dissolved, outgases containing organic materials causing contamination of the substrate are generated.

Moreover, when an inner tube collapse suppression member fixed to the manifold 28 by a bolt is provided, a reaction product (by-product) generated during the processing of the substrate within the inner tube 22 is frequently adhered around the inner tube collapse suppression member. If the inner tube collapse suppression member is forcibly detached in such a state that the reaction product is adhered thereto, the bolt or the manifold made of the non-metal component may be broken.

Therefore, in this embodiment, the heat insulation cylinder 90 made of an opaque material is installed between the bottom sides of the inner tube 22 and the outer tube 20 so as to make it difficult for radiant heat from the heater 14 to be directly irradiated onto the third seal member 85 even in the standby state. Due to the heat insulation cylinder 90, radiant heat from the heat source is shielded, and temperature rise of the third seal member 85 is suppressed. Consequently, dissolution of the third seal member 85 by heat is suppressed, while the seal performance of the third seal member 85 is maintained. In addition, the heat insulation cylinder 90 is installed so that the inner tube 22 is protected from earthquake. Therefore, the heat insulation cylinder 90 also functions as the inner tube collapse suppression member. Since the heat insulation cylinder 90 absorbs heat, it is in a heated state. Thus, the heat insulation cylinder 90 used as the inner tube collapse suppression member also functions as the heat absorption member, thereby suppressing the reaction product from being adhered around the heat insulation cylinder 90.

Figure 6:
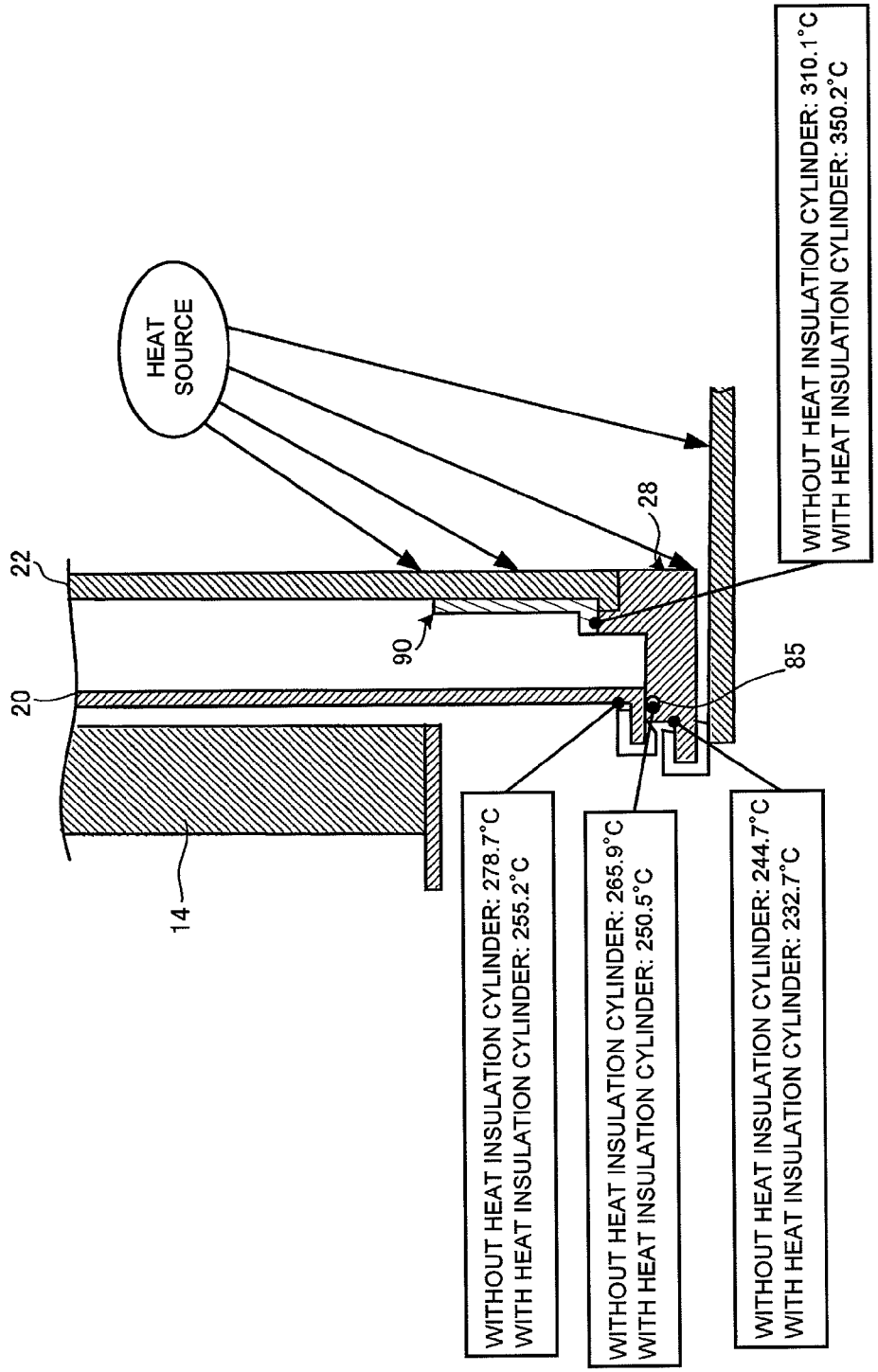
FIG. 6 illustrates comparison of temperature around a sealing member in a first embodiment of the present invention.

As illustrated in FIG. 6, in the substrate processing apparatus in accordance with the embodiment of the present invention, the heater 14 used as the heat source is set to 700° C., and temperatures around the third seal member 85 and the heat insulation cylinder 90 when the heat insulation cylinder 90 is used are compared with those when the heat insulation cylinder 90 is not used.

The temperature around the opening of the outer tube 20 over the third seal member 85 was 278.7° C. when the heat insulation cylinder 90 was not used, and 255.2° C. when the heat insulation cylinder 90 was used. That is, when the heat insulation cylinder 90 was used, a temperature reduction effect was −23.5° C.

Also, the temperature around the third seal member 85 was 265.9° C. when the heat insulation cylinder 90 was not used, and 250.5° C. when the heat insulation cylinder 90 was used. That is, when the heat insulation cylinder 90 was used, a temperature reduction effect was −15.4° C.

Also, the temperature around the manifold 28 under the third seal member 85 was 244.7° C. when the heat insulation cylinder 90 was not used, and 232.7° C. when the heat insulation cylinder 90 was used. That is, when the heat insulation cylinder 90 was used, a temperature reduction effect was −12.0° C.

Therefore, when the heat insulation cylinder 90 was used, the temperature rise was suppressed in any position around the third seal member 85.

Moreover, the temperature in the manifold 28 of the heat insulation cylinder 90 was 310.1° C. when the heat insulation cylinder 90 was not used, and 350.2° C. when the heat insulation cylinder 90 was used. That is, when the heat insulation cylinder 90 was used, a temperature reduction effect was 40.1° C.

Therefore, in the vicinity of the heat insulation cylinder 90, the temperature rise suppresses the adhesion of the reaction by-product.

Also, for example, if the temperature of the heater 14 is lowered immediately after the termination of the process so as to improve throughput, residual gas between the outer tube 20 and the inner tube 22 is solidified and therefore the bolts 91 restricting the heat insulation cylinder 90 or the inner tube 22 may be fastened. However, since the heat insulation cylinder 90 absorbs heat and thus is in a heated state, solidification of residual gas is suppressed when it contacts the heat insulation cylinder 90 or the bolts 91. Consequently, the heat insulation cylinder 90 makes it easy to take off the inner tube 22.

Figure 7B:
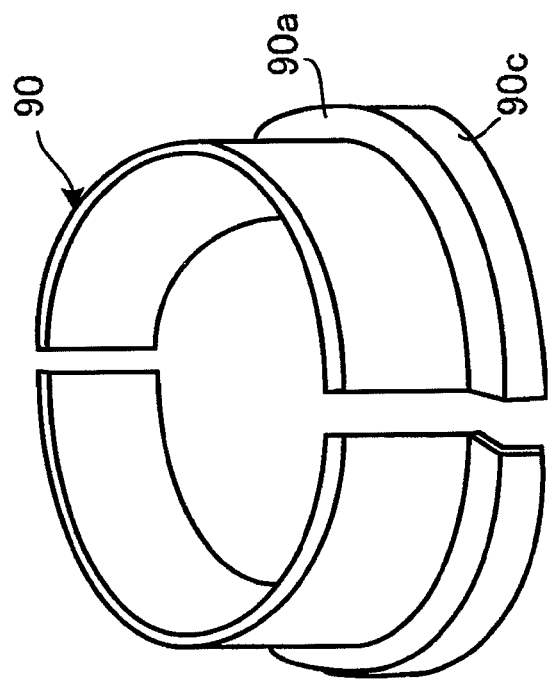
FIG. 7B is a perspective view illustrating the heat insulation cylinder in a second embodiment of the present invention.
Figure 7A:
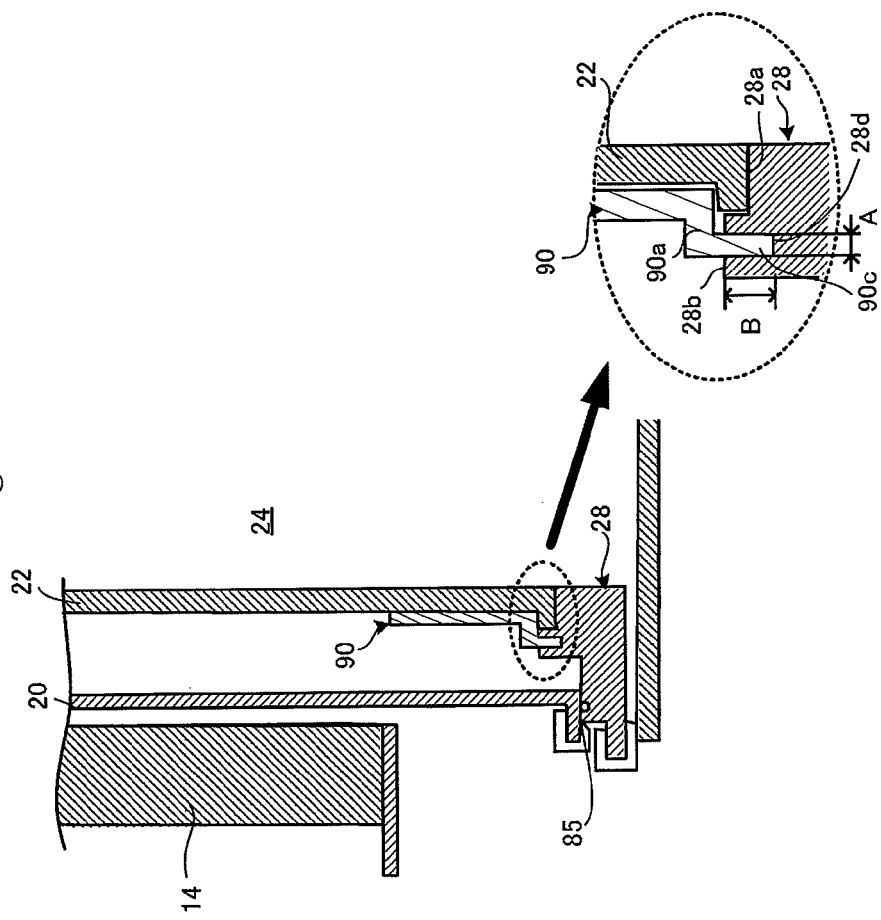
FIG. 7A is a longitudinal sectional view illustrating the installation of a heat insulation cylinder in a second embodiment of the present invention.

FIG. 7A and FIG. 7B illustrate an installation example of the heat insulation cylinder 90 in a second embodiment of the present invention.

In the second embodiment, a lower cylinder part 90c is provided as a movement restriction member protruding downward from the outer periphery of the bottom surface 90a of the heat insulation cylinder 90 in a vertical direction. The lower cylinder part 90c of the heat insulation cylinder 90 is inserted into a groove 28d formed in the second placement part 28b of the manifold 28. Therefore, the horizontal movement and the oblique upward movement of the heat insulation cylinder 90 are suppressed. At the same time, since the horizontal movement of the inner tube 22 is suppressed by the lower cylinder part 90c of the heat insulation cylinder 90 and the groove 28d formed in the second placement part 28b, the oblique upward movement of the heat insulation cylinder 90 is also suppressed. Preferably, the relationship between the thickness A of the cylinder part 90c and the depth B of the groove 28d is A<B. Such a setting suppresses a rotational moment that is generated when the inner tube 22 moves upward.

In accordance with the second embodiment, in addition to the effect of the first embodiment, if the heat insulation cylinder 90 is fixed to the manifold 28 by the bolt like the first embodiment, it may be difficult to detach from the manifold due to the effect of the heat and by-product. Thus, the manifold 28 must be replaced. However, in accordance with the current embodiment, since the bolt is not used, the above problem can be avoided and the detaching work can be facilitated.

Figure 8:
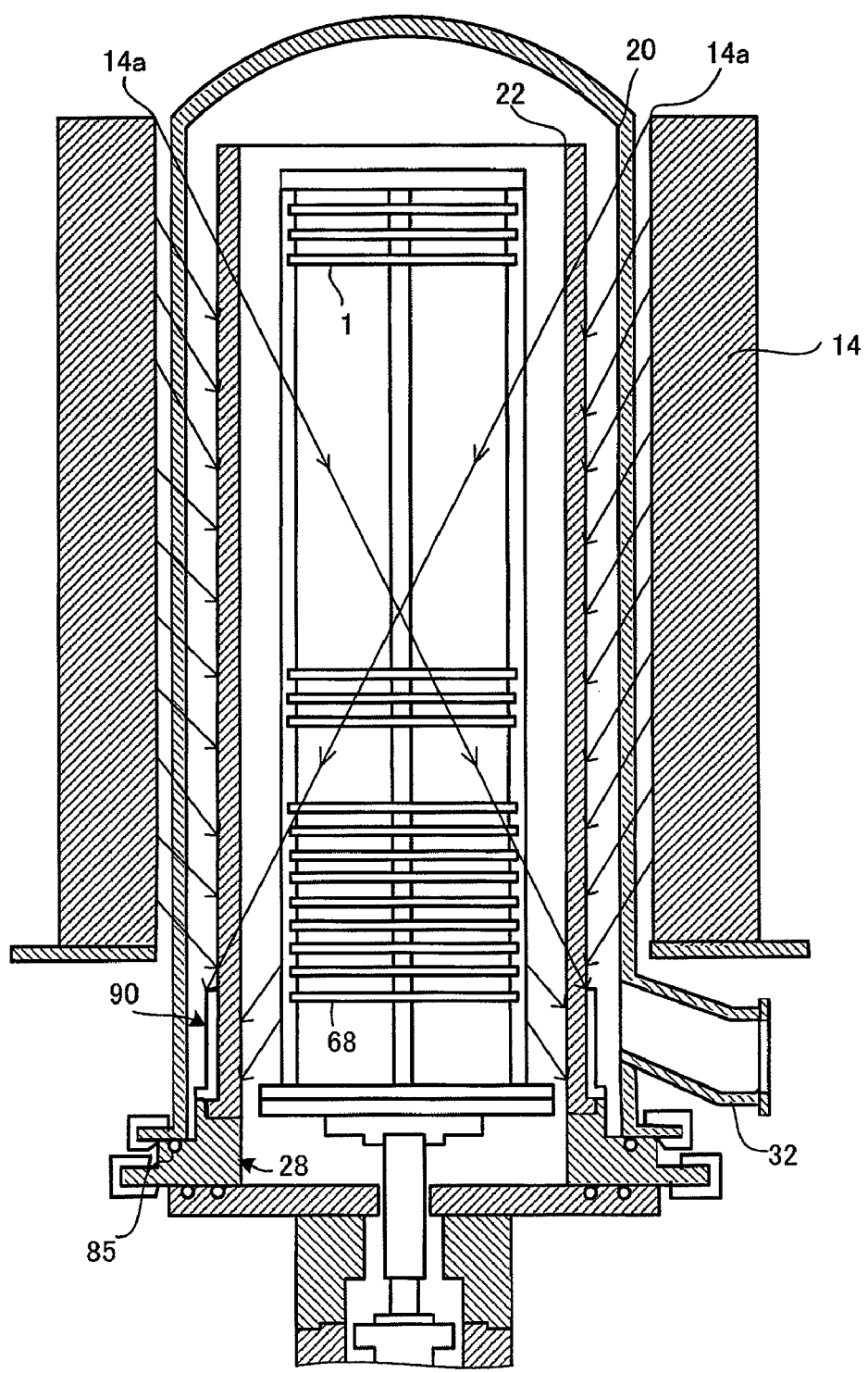
FIG. 8 is a longitudinal sectional view illustrating heat radiation of a substrate processing apparatus in a third embodiment of the present invention.

In a third embodiment of the present invention, as illustrated in FIG. 8, the height of the heat insulation cylinder 90 is set, from the top end to the bottom end of the heater 40, to be higher than the height of shielding the heating wire of the heating element, so that the heating wire of each heater 14, that is, the heating element, does not directly reach the third seal member 85. That is, the heat insulation cylinder 90 is set to be higher than the wire (heating wire) connecting the top end 14a of the heater 14 and the third seal member 85. In this manner, the temperature rise of the third seal member 85 is suppressed.

Figure 9A:
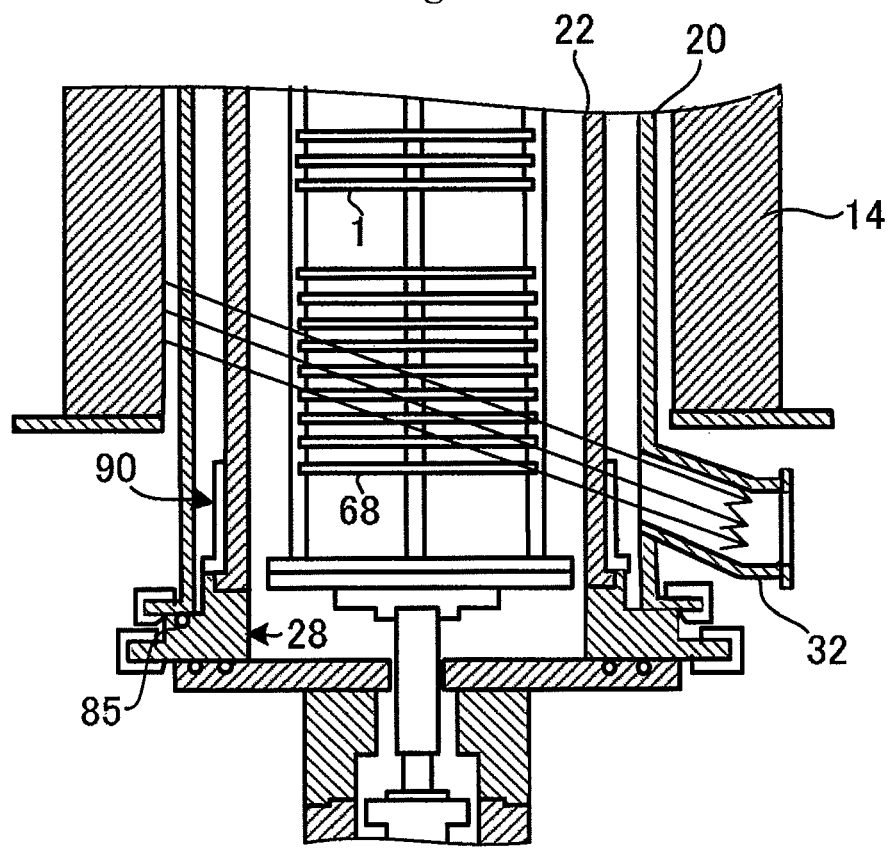
FIG. 9A is a longitudinal sectional view illustrating the installation of a heat insulation cylinder in a fourth embodiment of the present invention.
Figure 9B:
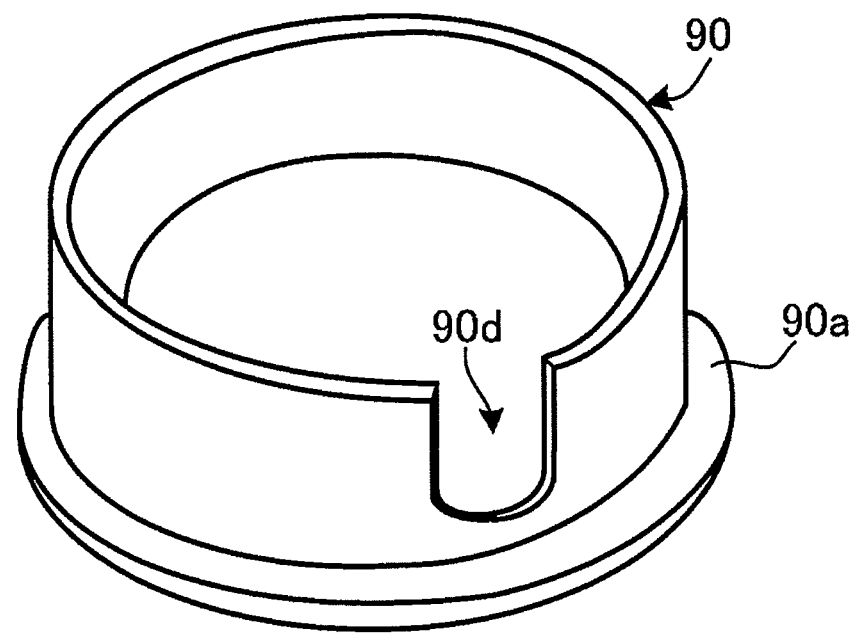
FIG. 9B is a perspective view illustrating a heat insulation cylinder in a fourth embodiment of the present invention.

Herein, when the heat insulation cylinder 90 is provided, the temperature of the exhaust pipe 32 located at a position far from the center of the furnace becomes low and thus by-product may be adhered thereto. In a fourth embodiment of the present invention, as illustrated in FIG. 9, a region facing the exhaust pipe 32 of the heat insulation cylinder 90 is notched upward to form a notch part 90d. Therefore, the heating wire of the heater 14 is partially received in the exhaust pipe 32, and the temperature of the exhaust pipe 32 partially rises. Hence, adhesion of by-product to the exhaust pipe 32 is prevented. Particularly, since the exhaust passage is curved at the lower part around an exhaust port inside the exhaust pipe 32, by-product is easily adhered. However, if the height of the bottom surface of the notch of the notch part 90d is set at the lower part around the exhaust port of the exhaust pipe 32 so high that the heating wire of the heater 14 directly arrives, adhesion of by-product is further suppressed.

In addition, the provision of the pipe heater at the outer periphery of the exhaust pipe 32 causes the problems of the cost increase, the waste of the space, and the complicated control. However, in accordance with the fourth embodiment of the present invention, the occurrence of those problems can be avoided.

Furthermore, in order to prevent the temperature rise of the seal member around the notch part 90d, the thickness of the heat insulation cylinder 90 where the notch part 90d is provided just therebelow may be thick. In this manner, the temperature rise of the third seal member 85 around the exhaust pipe 32 is prevented.

Figure 10A:
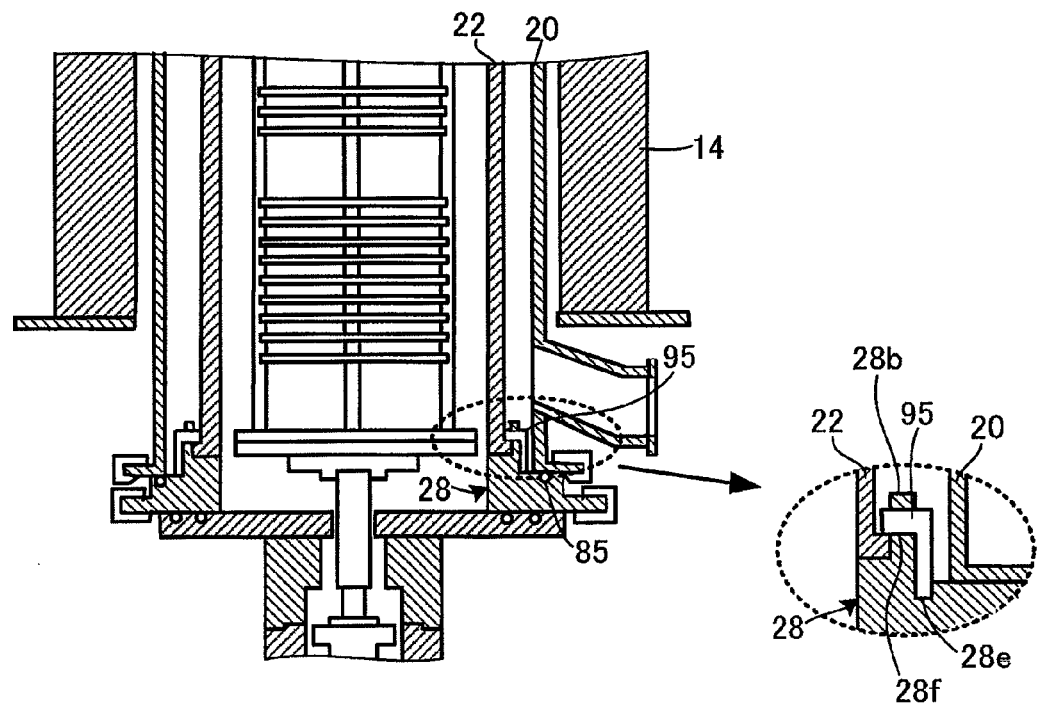
FIG. 10A and FIG. 10B are a longitudinal sectional view and a perspective view, respectively, illustrating a main part of a substrate processing apparatus in a fifth embodiment of the present invention.
Figure 10B:
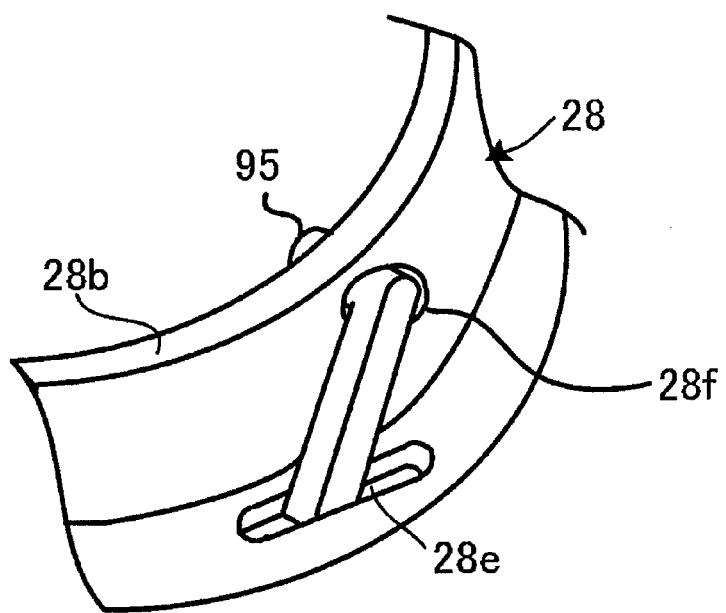

FIG. 10 illustrates a fifth embodiment of the present invention.

In the fifth embodiment, a counterbored hole 28e is provided in the surface of the manifold 28 where the outer tube 20 is installed, and a through-hole 28f is provided on a sidewall of the second placement part 28b of the manifold 28. An inner tube pin 95 is installed as a movement restriction member that restricts the inner tube 22 to the counterbored hole 28e and the through-hole 28f. Therefore, transverse misalignment of the inner tube 22 is prevented, and the longitudinal misalignment of the inner tube 22 is prevented by inserting the inner tube pin 95.

As described above, in the case of the bolt fastening, it is difficult to take off the adhered by-product. However, in the case of the pin shape, even when the by-product is adhered, it is easy to take off the adhered by-product. Moreover, since metal contamination of the wafer is minimized, quarts parts inside the process chamber are protected when earthquake occurs.

Figure 11:
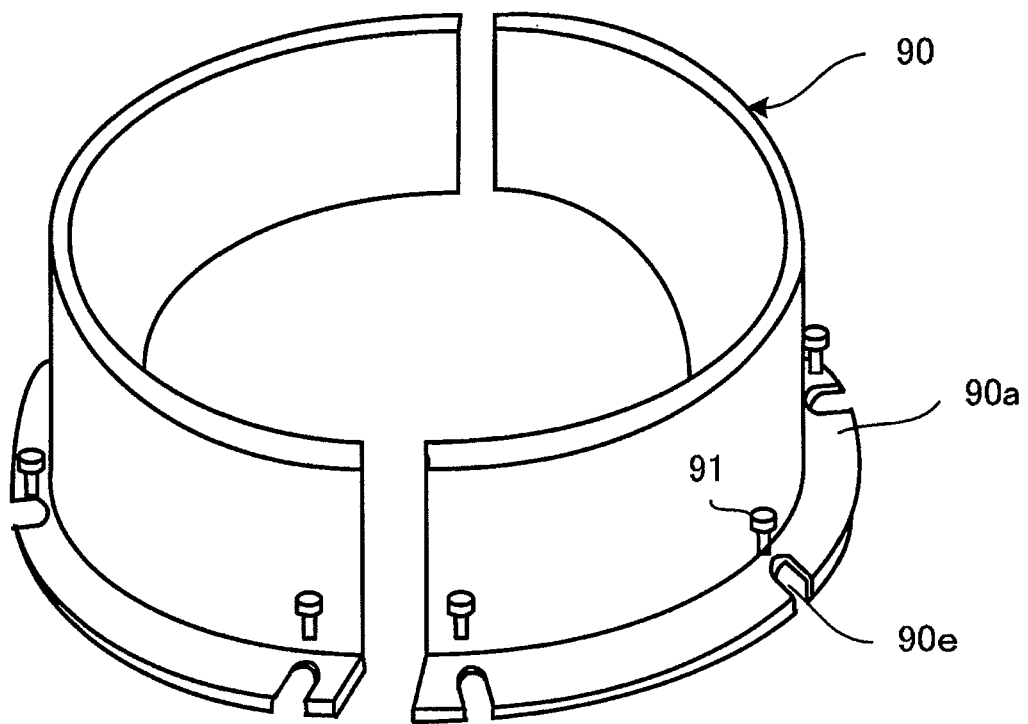
FIG. 11 is a perspective view illustrating a heat insulation cylinder in a sixth embodiment of the present invention.

FIG. 11 illustrates a sixth embodiment of the present invention.

In the first embodiment, in the case where the heat insulation cylinder 90 is fixed by the bolt 91, it must be overcrowded when the tap hole 28c installed in the manifold 28 is looked through the aperture of the bolt hole 90d. Also, since the bottom surface 90a as a lower flange part of the heat insulation cylinder 90 is small while the cylindrical part of the inner tube 22 is large, it is difficult to look into the hole. Moreover, since the interval between the outer tube 20 and the inner tube 22 is narrow, the sizes of the bottom surface 90a of the heat insulation cylinder 90 and the bolt 91 cannot be made large. In the sixth embodiment, by substituting with the bolt hole 90b installed in the bottom surface 90a that is the lower flange part of the heat insulation cylinder 90 of the first embodiment, the notch 90e cut radially from the outer periphery of the bottom surface 90a is provided in the bottom surface 90a. The bolt 91 used as the movement restriction member is fixed into the tap hole 28c of the manifold 28 through the notch 90e, such that the movement of the heat insulation cylinder 90 is restricted. Therefore, since the tap position can be observed from the side of the lower flange part when the corresponding bolt 91 is fixed into the tap hole 28c of the manifold 28, the workability can be improved and the size of the lower flange part can be made small.

Figure 12A:
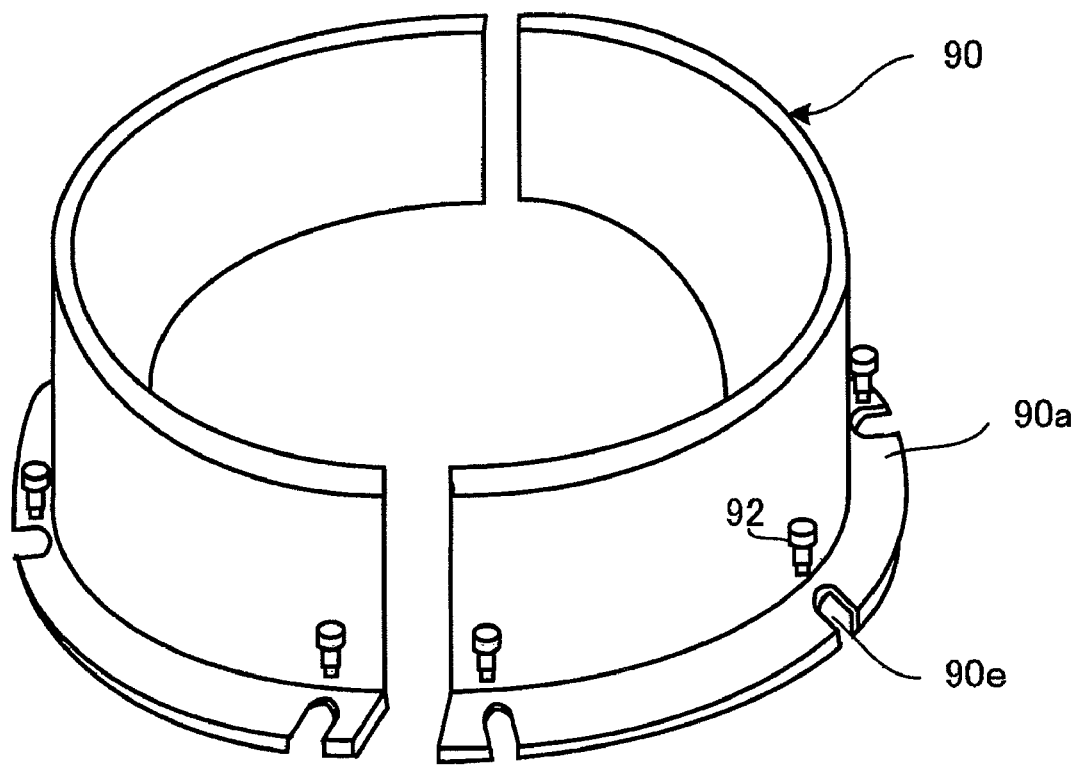
FIG. 12A is a perspective view illustrating a heat insulation cylinder in a seventh embodiment of the present invention.
Figure 12B:
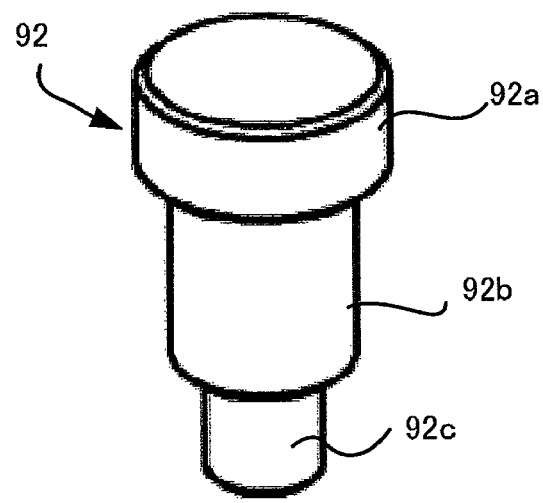
FIG. 12B is a perspective view illustrating a bolt installed in the heat insulation cylinder in a seventh embodiment of the present invention.

FIG. 12 illustrates a seventh embodiment of the present invention.

In the above-described embodiment, when the heat insulation cylinder 90 is fixed by the bolt 91, the heat insulation cylinder 90 is fixed to the manifold 28 by the bolt 91 at a position far from the apparatus and then is transported to the apparatus. The bolt 91 may be damaged by vibration during the transport. In the seventh embodiment, a bolt 92 that is the movement restriction member is used as the bolt 91 in the first embodiment and the above-described sixth embodiment. The bolt 92 is a stepped bolt and is configured by a lower part 92c inserted into the tap hole 28c of the manifold 28, a middle part 92b inserted into the notch 90e, and a head part 92a. The diameter of the middle part 92b is larger than that of the lower part 92c and is smaller than that of the notch 90e. Also, the middle part 92b is longer relative to the thickness of the lower flange part of the heat insulation cylinder 90. The diameter of the head part 92a is larger than that of the middle part 92b and is larger than the notch 90e. That is, gap is formed between the lower part 90a, which is the bottom surface 90a of the lower flange part of the heat insulation cylinder 90, and the head part 92a of the bolt 92. Therefore, the bolt 92 is protected from damage by preventing the force by vibration from being directly transferred to the bolt 92.

The present invention relates to a semiconductor manufacturing technology, and in particular, to a heat treatment technology that accommodates a target substrate in a process chamber and processes the target substrate in such a state that it is heated by a heater. For example, the present invention may be usefully applied to a substrate processing apparatus that is used in an oxidation process or diffusion process on a semiconductor wafer where a semiconductor integrated circuit (semiconductor device) is to be manufactured, a carrier activation after ion implantation, a reflow for planarization, or a film-forming process by an annealing and thermal CVD reaction.

In accordance with the embodiments of the present invention, metal contamination of the substrate is prevented, and collapse of the inner tube is prevented, and, moreover, adhesion of reaction products is suppressed.

In accordance with an embodiment of the present invention, there is provided a substrate processing apparatus comprising: an outer tube; a manifold connected to the outer tube and made of a non-metal material; an inner tube disposed in the manifold at a more inner side than the outer tube and configured to process a substrate therein; a heating device installed at a more outer side than the outer tube and configured to heat the inside of the outer tube; a lid configured to open and close an opening of the manifold, with a seal member intervened therebetween; and a heat absorption member installed in the manifold, with a bottom end of the inner tube intervened therebetween, and configured to absorb heat from the heating device, the heat absorption member being made of a non-metal material.

Preferably, an exhaust pipe is installed in the outer tube or the manifold, and a portion of the heat absorption member facing the exhaust pipe of the heat absorption member includes a notch part that is notched upward.

Preferably, a stepped portion is formed at an upper part of the manifold; a first placement part on which the inner tube is placed is formed at a lower part of the stepped portion; a second placement part on which the heat absorption member is placed is formed at an upper part of the stepped portion; and a movement restriction unit is installed in the second placement part such that movement of the heat absorption member is restricted.

Preferably, a stepped portion is formed at an upper part of the manifold; a first placement part on which the inner tube is placed is formed at a lower part of the stepped portion; a second placement part on which the heat absorption member is placed is formed at an upper part of the stepped portion; an inner surface of the heat absorption member is installed spaced apart from an outer surface of the inner tube; the heat absorption member is installed from the second placement part across a bottom surface installed at the opening side of the inner tube placed in the first placement part; a notch part cut radially is formed in the bottom surface of the heat absorption member; and a movement restriction member is installed in the notch part such that movement of the heat absorption member is restricted.

In accordance with another embodiment of the present invention, there is provided a method of manufacturing a semiconductor device in a substrate processing apparatus including an outer tube, a manifold connected to the outer tube and made of a non-metal material, an inner tube disposed in the manifold at a more inner side than the outer tube, the method comprising: loading a substrate into the inner tube, and closing an opening of the manifold with a lid, with a seal member intervened therebetween; heating the substrate disposed inside the inner tube by using a heating device, and absorbing heat from the heating device by using a heat absorption member installed in the manifold, with a bottom end of the inner tube intervened therebetween, the heat absorption member being made of a non-metal material.

Preferably, the manifold is made of a transparent quartz member.

Preferably, the heat absorption member is made of an opaque quartz member.

Preferably, the heat absorption member includes a protrusion part that is inserted into a groove provided in the manifold.

Preferably, the heat absorption member extends at least to a position that shields a heating wire connecting a top end of a heating element, which is installed in the heating device to heat the substrate, and the seal member.

Preferably, the heat absorption member is disposed concentrically with the inner tube.

In accordance with another embodiment of the present invention, there is provided a substrate processing apparatus comprising: an outer tube; a manifold connected to the outer tube and made of a non-metal material; an inner tube disposed in the manifold at a more inner side than the outer tube and configured to process a substrate therein; a heating device installed at a more outer side than the outer tube and configured to heat the inside of the outer tube; a lid configured to open and close an opening of the manifold, with a seat member intervened therebetween; and a press member configured to press a bottom end of the inner tube, wherein a guard part is formed at a lower outer side of the inner tube, the manifold comprises: an inner tube placement part on which the inner tube is placed; a protrusion part formed at a more outer periphery than the inner tube placement part and formed higher than the height of the guard part with respect to the inner tube placement part; and a groove part installed at a more outer periphery than the protrusion part, and one end of the press member is inserted into the protrusion part, and the other end of the press member is inserted into the groove part.

Preferably, the manifold is made of a transparent quartz member.

What is claimed is:
1. A substrate processing apparatus comprising:
an outer tube;
a manifold connected to the outer tube, the manifold being made of a non-metal material;
an inner tube disposed on the manifold at a more inner side than the outer tube and configured to process a substrate therein;
a heating device installed at a more outer side than the outer tube and configured to heat an inside of the outer tube;
a lid configured to open and close an opening of the manifold,
wherein a seal member is intervened between the lid and the manifold; and
a heat absorption member installed on the manifold,
wherein a bottom end of the inner tube is intervened between the heat absorption member and the manifold, and wherein the heat absorption member is configured to absorb heat from the heating device and is made of a non-metal material.

2. The substrate processing apparatus of claim 1, wherein an exhaust pipe is installed in the outer tube or the manifold, and the heat absorption member comprises a notch part notched upward at a portion thereof where the heat absorption member faces the exhaust pipe.

3. The substrate processing apparatus of claim 1,
wherein a stepped portion is disposed at an upper part of the manifold,
wherein a first placement part having the inner tube placed thereon is disposed at a lower part of the stepped portion,
wherein a second placement part having the heat absorption member placed thereon is disposed at an upper part of the stepped portion, and
wherein a movement restriction unit is installed in the second placement part such that movement of the heat absorption member is restricted.

4. The substrate processing apparatus of claim 1,
wherein a stepped portion is disposed at an upper part of the manifold,
wherein a first placement part having the inner tube placed thereon is disposed at a lower part of the stepped portion,
wherein a second placement part having the heat absorption member placed thereon is disposed at an upper part of the stepped portion,
wherein an inner surface of the heat absorption member is installed to be spaced apart from an outer surface of the inner tube,
wherein a bottom surface of the heat absorption member is in contact with the second placement part and a to surface of a protrusion part of the inner tube,
wherein a notch part cut radially is disposed on the bottom surface of the heat absorption member, and
wherein a movement restriction member is installed in the notch part such that movement of the heat absorption member is restricted.

5. The substrate processing apparatus of claim 1, wherein the heat absorption member comprises a protrusion part inserted in a groove provided in the manifold.

6. The substrate processing apparatus of claim 1, wherein the heat absorption member extends to at least a position where a heating wire, which connects a top end of a heating element installed in the heating device to heat the substrate and the seal member, is shielded.

7. The substrate processing apparatus of claim 4, wherein the movement restriction member comprises a bolt.

8. The substrate processing apparatus of claim 7, wherein the bolt is installed such that a gap is provided between a head part of the bolt and the bottom surface of the heat absorption member.

9. A substrate processing apparatus comprising:
an outer tube;
a manifold connected to the outer tube, the manifold being made of a non-metal material;
an inner tube disposed on the manifold at a more inner side than the outer tube and configured to process a substrate therein;
a heating device installed at a more outer side than the outer tube and configured to heat an inside of the outer tube;
a lid configured to open and close an opening of the manifold with a seal member intervened between the lid and the manifold; and
a press member configured to press a bottom end of the inner tube,
wherein a guard part is disposed at a lower outer side of the inner tube,
wherein the manifold comprises:
an inner tube placement part having the inner tube placed thereon;
a protrusion part disposed at a more outer periphery than the inner tube placement part and higher than a height of the guard part with respect to the inner tube placement part; and
a groove part installed at a more outer periphery than the protrusion part, and
wherein one end of the press member is inserted into the protrusion part, and the other end of the press member is inserted into the groove part.

* * * * *